United States Patent
Yamada et al.

(10) Patent No.: US 8,872,063 B2
(45) Date of Patent: Oct. 28, 2014

(54) METHOD FOR PRODUCING BLANK PRINTING SLEEVE FOR LASER ENGRAVING

(75) Inventors: Hiroshi Yamada, Tokyo (JP); Miyoshi Watanabe, Tokyo (JP)

(73) Assignee: Asahi Kasei E-Materials Corporation, Tokyo (JP)

(*) Notice: Subject to any disclaimer, the term of this patent is extended or adjusted under 35 U.S.C. 154(b) by 960 days.

(21) Appl. No.: 12/997,445

(22) PCT Filed: Jun. 12, 2009

(86) PCT No.: PCT/JP2009/060802
§ 371 (c)(1),
(2), (4) Date: May 3, 2011

(87) PCT Pub. No.: WO2009/151126
PCT Pub. Date: Dec. 17, 2009

(65) Prior Publication Data
US 2011/0198323 A1 Aug. 18, 2011

(30) Foreign Application Priority Data
Jun. 12, 2008 (JP) .................. 2008-153843

(51) Int. Cl.
*B23K 26/38* (2014.01)
*B26D 3/00* (2006.01)
*B41N 1/16* (2006.01)
*G03F 7/24* (2006.01)
*B41C 1/10* (2006.01)
*B41C 1/05* (2006.01)
*B41C 1/18* (2006.01)
*G03F 7/18* (2006.01)
*B41N 1/12* (2006.01)

(52) U.S. Cl.
CPC . *B41C 1/184* (2013.01); *B41N 1/16* (2013.01); *G03F 7/24* (2013.01); *B41C 1/1033* (2013.01); *B41C 1/05* (2013.01); *G03F 7/18* (2013.01); *B41N 1/12* (2013.01)
USPC ................. 219/121.69; 83/53; 219/121.72

(58) Field of Classification Search
CPC ............. B23K 26/4065; B23K 26/367; B23K 26/0823; B41C 1/02; B41C 1/1008; B41C 1/1003
USPC ............. 219/121.68, 121.69, 121.67, 121.72; 83/16, 53; 451/36; 156/123, 154, 159, 156/244.18, 244.19; 101/453, 454
See application file for complete search history.

(56) References Cited

U.S. PATENT DOCUMENTS

| 5,344,753 A | 9/1994 | Mauck et al. |
| 5,499,580 A | 3/1996 | Hoffmann et al. |

(Continued)

FOREIGN PATENT DOCUMENTS

| JP | H06-46894 A | 6/1994 |
| JP | 07-186358 | 7/1995 |

(Continued)

OTHER PUBLICATIONS

Machine translation of Japan Patent document No. 2007-021,898, Feb. 2014.*

(Continued)

*Primary Examiner* — Geoffrey S Evans
(74) *Attorney, Agent, or Firm* — Finnegan, Henderson, Farabow, Garrett & Dunner, L.L.P.

(57) ABSTRACT

The present invention provides a method for producing a blank printing sleeve for laser engraving, comprising: (1) a step of laminating a photosensitive resin composition layer (a) on a hollow cylindrical support (b); (2) a step of photocuring the laminated photosensitive resin composition layer (a) to form a cured photosensitive resin layer (c); and (3) a step of cutting the hollow cylindrical support (b) and the cured photosensitive resin layer (c) approximately in a circumferential direction of the hollow cylindrical support (b) by a laser cutting method and/or a water beam cutting method.

11 Claims, 2 Drawing Sheets

(56) References Cited

U.S. PATENT DOCUMENTS

| | | | |
|---|---|---|---|
| 5,654,125 A * | 8/1997 | Fan et al. | 430/306 |
| 5,798,202 A | 8/1998 | Cushner et al. | |
| 5,904,095 A * | 5/1999 | Nelson | 101/375 |
| 2002/0034610 A1 * | 3/2002 | Perez et al. | 428/141 |
| 2002/0187292 A1 * | 12/2002 | Singler et al. | 428/36.91 |
| 2004/0157162 A1 | 8/2004 | Yokota et al. | |
| 2004/0187721 A1 * | 9/2004 | Salvestro | 101/463.1 |
| 2006/0230964 A1 * | 10/2006 | Watanabe et al. | 101/454 |
| 2008/0305436 A1 | 12/2008 | Shishkin | |
| 2009/0025592 A1 * | 1/2009 | Gelbart | 101/453 |

FOREIGN PATENT DOCUMENTS

| | | |
|---|---|---|
| JP | 2846954 | 10/1998 |
| JP | 2005-219378 | 8/2005 |
| JP | 2006-46894 | 2/2006 |
| JP | 3801592 | 5/2006 |
| JP | 2006-326938 | 12/2006 |
| JP | 2007-21898 | 2/2007 |
| JP | 2008-94030 | 4/2008 |
| WO | WO 2008/153877 A1 | 12/2008 |

OTHER PUBLICATIONS

Machine translation of Japan Patent document No. 2008-094030, Feb. 2014.*

Office Action for JP Application No. 2010-516898 mailed Oct. 1, 2012.

English-Language Translation of Japanese Search Report for International Application No. PCT/JP2009/060802, mailing dated Sep. 15, 2009.

International Preliminary Report on Patentability dated Jan. 20, 2011 issued in corresponding International Application No. PCT/JP2009/060802.

* cited by examiner

METHOD FOR PRODUCING BLANK PRINTING SLEEVE FOR LASER ENGRAVING

TECHNICAL FIELD

The present invention relates to a method for producing a blank printing sleeve for laser engraving, and an apparatus for producing a blank printing sleeve for laser engraving.

BACKGROUND ART

In recent years, a laser engraving method has been used in surface treatment for printing such as flexographic printing and dry offset printing in which resin relief printing plates are used, and that for embossing. The laser engraving method is a method for forming a relief and projection pattern on a surface by removing a part of a resin irradiated with a laser beam.

Example of materials used for the laser engraving method include vulcanized rubbers, cured products of photosensitive resins obtained by photo-curing a photosensitive resin composition, and cured products of thermosetting resins obtained by curing a thermosetting resin composition by heat treatment. A technique to perform laser engraving on a cured product of a photosensitive resin has been increasingly used from the viewpoint of reduction in processing time.

Conventionally, printing plates have been produced by a pattern forming method using a sheet-like photosensitive resin original plate and a photomechanical processing technique or a pattern forming method using a sheet-like resin original plate and a laser engraving technique. However, a technique for producing a printing sleeve has been developed for demands such as reduction in a time for registration during a printing step, reduction in an amount of unnecessary printed matters by reducing a printing adjustment time, and high-speed printing.

In the pattern forming method using the photomechanical processing technique, in the case where a metallic cylinder or a light-intransmissive cylindrical support made of a fiber reinforced plastic is used, back exposure (solid exposure from a rear surface of the blank printing sleeve through a light-transmissive sheet-like support) necessary for production of a printing sleeve base serving as foundation of the pattern is difficult. For that reason, pattern formation is insufficient so that printing quality is affected. The photomechanical processing technique needs complicated processing such as exposure, development, and drying. Furthermore, a configuration of the blank printing sleeve is also complicated: for example, in order to form a pattern based on digital data, a step of laminating a black thin film for producing an exposure mask by burning off a printing sleeve surface with near-infrared laser is needed.

On the other hand, the pattern forming method using the laser engraving technique can form a pattern on a surface of a resin plate freely by engraving by laser. Because the digital data can be directly processed with a laser engraving apparatus, the laser engraving technique has no problem mentioned above, and attracts attention as a method for producing a printing sleeve.

In a printing technique for narrow web, dry offset can printing, and the like in the flexographic printing, narrow printing plates are used.

Furthermore, in the field of the flexographic printing, hollow cylindrical supports made of a fiber reinforced plastic are used for an increasing demand for high-speed printing properties. Patent Document 1 discloses a laser engraving blank printing sleeve made of a thermoplastic elastomer as a main raw material and obtained by molding a sheet-like photosensitive resin into a cylindrical shape.

Patent Document 2 discloses a method for producing a blank printing sleeve using a liquid photosensitive resin.

Patent Document 3 discloses a method for producing a printing original plate by a cutting step of dividing a blank printing sleeve into some specified blank printing sleeves.

PATENT DOCUMENTS

Patent Document 1: Japanese Patent No. 2846954
Patent Document 2: Japanese Patent No. 3801592
Patent Document 3: Japanese Patent Application Laid-Open No. 2007-21898

SUMMARY OF INVENTION

Problem to be Solved by the Invention

Actually, however, in the conventional blank printing sleeve and the conventional method for producing a printing sleeve, no method that can produce a large amount of a narrow blank printing sleeve with high tolerance in size in a short time and can easily process the blank printing sleeve and edge parts of the blank printing sleeve with high accuracy and no production apparatus suitable for a method for producing the blank printing sleeve and the printing sleeve are yet known.

Additionally, a fiber material having a high modulus of elasticity is used for the fiber reinforced plastics. For this reason, when the fibers are exposed from the edge parts of the printing sleeve or projections and reliefs exist in edges of a resin portion that functions as the printing sleeve, hands may get injured at the time of handling the printing sleeve, such as attaching the printing sleeve to an air cylinder. Moreover, the exposed fibers may enter between the air cylinder and a hollow cylindrical support to reduce printing accuracy or to make it difficult to detach the printing sleeve. Therefore, a method and a production apparatus allowing easy and precise processing at a step of processing the edge parts of the printing sleeve are not yet known.

Patent Documents 1 and 2 have neither disclosure nor suggestion with respect to such a technique for producing a large amount of narrow printing sleeves with high tolerance in size in a short time, and have neither technical disclosure nor suggestion from the viewpoint of processing the edge parts of the printing sleeve.

Patent Document 3 discloses no specific measures about the cutting step. Since production of cutting wastes at the cutting step and a cutting apparatus as a cutting means are disclosed therein, it can be said that the cutting means disclosed in Patent Document 3 is a cutting method by a cutter. In the cutting method by a cutter in Patent Document 3, scratches by cutting are easily produced in a cut portion of the cut blank printing sleeve. In the case where a reinforced fiber plastic is used for the hollow cylindrical support, the fibers tend to be projected from the cut portion, causing reduction in printing accuracy and difficulties in use and handling.

Namely, in order to solve the problems, an object of the present invention is to provide a method and a production apparatus used for the method wherein in a method for producing a blank printing sleeve, a large amount of narrow blank printing sleeves can be produced with high tolerance in size in a short time, and the blank printing sleeve and edge parts of the printing sleeve can easily be processed with high accuracy.

Means for Solving the Problems

As a result of extensive examination in order to solve the above-mentioned problems, the present inventors found out that the above-mentioned problems can be solved by a method for producing a blank printing sleeve for laser engraving, comprising: (1) a step of laminating a photosensitive resin composition layer (a) on a hollow cylindrical support (b); (2) a step of photo-curing the laminated photosensitive resin composition layer (a) to form a cured photosensitive resin layer (c); and (3) a step of cutting the hollow cylindrical support (b) and the cured photosensitive resin layer (c) approximately in a circumferential direction of the hollow cylindrical support (b) by a laser cutting method and/or a water beam cutting method. Thus, the present inventors have completed the present invention.

The present invention is as follows.

1.

A method for producing a blank printing sleeve for laser engraving, comprising the steps of:

(1) laminating a photosensitive resin composition layer (a) on a hollow cylindrical support (b);

(2) photo-curing the laminated photosensitive resin composition layer (a) to form a cured photosensitive resin layer (c); and (3) cutting the hollow cylindrical support (b) and the cured photosensitive resin layer (c) approximately in a circumferential direction of the hollow cylindrical support (b) by a laser cutting method and/or a water beam cutting method.

2.

The method for producing the blank printing sleeve for laser engraving according to 1., wherein the step (3) comprises a step of cutting the hollow cylindrical support (b) while rotating the hollow cylindrical support (b) approximately in the circumferential direction thereof.

3.

The method for producing the blank printing sleeve for laser engraving according to 1. or 2., wherein the step (3) further comprises a step of forming a notch for registration in the formed cut portion.

4.

The method for producing the blank printing sleeve for laser engraving according to 3., wherein the notch is formed on an approximately straight line in a long axial direction of the hollow cylindrical support (b).

5.

The method for producing the blank printing sleeve for laser engraving according to 3., wherein a defective portion exists in the cured photosensitive resin layer (c), and the notch is formed to include the defective portion in a relief formed by laser engraving.

6.

The method for producing the blank printing sleeve for laser engraving according to any of 3. to 5., wherein the hollow cylindrical support (b) is fixed, and scanned with a laser beam and/or a water beam to form the notch.

7.

The method for producing the blank printing sleeve for laser engraving according to 6., wherein scanning with the laser beam is performed using a galvanomirror or a polygon mirror.

8.

The method for producing the blank printing sleeve for laser engraving according to any of 1. to 7., wherein the laser beam is an infrared ray having an oscillation wavelength of not less than 5 μM and not more than 20 μm or an ultraviolet ray having an oscillation wavelength of not less than 150 nm and not more than 400 nm, has a diameter of not less than 0.01 mm and not more than 1 mm, and has an average output of not more than 100 W.

9.

The method for producing the blank printing sleeve for laser engraving according to any of 1. to 8., wherein a pressure of the water beam is not less than 50 MPa and not more than 450 MPa, and a diameter of the water beam is not less than 0.05 mm and not more than 2 mm.

10.

The method for producing the blank printing sleeve for laser engraving according to any of 1. to 9., wherein the step (1) comprises the steps of:

winding the photosensitive resin composition layer (a) around the hollow cylindrical support (b); and welding ends of the photosensitive resin composition layer (a) in a direction approximately parallel to a long axis of the hollow cylindrical support (b).

11.

The method for producing the blank printing sleeve for laser engraving according to any of 1. to 9., wherein the step (1) comprises a step of extruding and laminating a photosensitive resin composition ($\alpha$) on the hollow cylindrical support (b).

12.

The method for producing the blank printing sleeve for laser engraving according to 11., wherein the step (1) further comprises a step of heating the photosensitive resin composition ($\alpha$) at not less than 100° C. and not more than 200° C. to liquefy the photosensitive resin composition ($\alpha$).

13.

The method for producing the blank printing sleeve for laser engraving according to any of 1. to 12., wherein the hollow cylindrical support (b) contains a fiber reinforced plastic having a thickness of not less than 0.1 mm and not more than 1.5 mm.

14.

The method for producing the blank printing sleeve for laser engraving according to 13., wherein the fiber reinforced plastic contains at least one fiber selected from glass fibers, polyamide fibers, polyimide fibers, polyester fibers, polyurethane fibers, cellulose fibers, carbon fibers, metallic fibers, and ceramic fibers.

15.

The method for producing the blank printing sleeve for laser engraving according to any of 1. to 14., wherein the step (3) comprises a step of cutting the blank printing sleeve for laser engraving into a length of not less than 100 mm and not more than 500 mm.

16.

The method for producing the blank printing sleeve for laser engraving according to any of 1. to 15., wherein the step (3) comprises a step of fixing the hollow cylindrical support (b) to a cylindrical support having an axis rotating the hollow cylindrical support (b) in a circumferential direction thereof.

17.

The method for producing the blank printing sleeve for laser engraving according to 16., wherein a protective layer exists in a surface of the cylindrical support, and the protective layer contains at least one metal selected from the group consisting of chromium, tungsten, tantalum, and titanium, and/or a metal oxide thereof.

18.

The method for producing the blank printing sleeve for laser engraving according to any of 1. to 17., wherein a length of an outer circumference of the blank printing sleeve for laser engraving is not less than 300 mm and not more than 1500 mm.

19.

A method for producing a laser engraved printing sleeve, comprising a step of forming an image by laser engraving on the blank printing sleeve for laser engraving produced by the method according to any of 1. to 18.

20.

An apparatus for producing a blank printing sleeve for laser engraving, comprising:

a laser cutting mechanism and/or a water beam cutting mechanism, a cylindrical support that fixes a hollow cylindrical support (b), and a holding mechanism that can rotate the cylindrical support, wherein the laser cutting mechanism and/or the water beam cutting mechanism have a mechanism for changing a position of a laser beam and/or a water beam and/or a mechanism for scanning.

21.

The apparatus for producing the blank printing sleeve for laser engraving according to 20., wherein the cylindrical support is a cylindrical support (d) having a contracting and expanding mechanism that enables change in an outer diameter of the cylindrical support.

22.

The apparatus for producing the blank printing sleeve for laser engraving according to 20., wherein the cylindrical support is an air cylinder, and is an air-lock type cylindrical support (e) having a plurality of small holes for air ejection on a surface of the air cylinder, each hole having a spherical object inside thereof.

23.

The apparatus for producing the blank printing sleeve for laser engraving according to 22, wherein the cylindrical support has on a surface thereof a groove corresponding to a cut position and having a depth of not less than 0.5 mm in a circumferential direction thereof.

24.

The apparatus for producing the blank printing sleeve for laser engraving according to any of 20. to 23., wherein the cylindrical support has in a surface thereof a protective layer containing at least one metal selected from the group consisting of chromium, tungsten, tantalum, and titanium and/or a metal oxide thereof.

Effect of the Invention

According to the present invention, it is possible to provide a method that can produce a large amount of narrow blank printing sleeves with high tolerance in size in a short time, and can easily process edge parts of the blank printing sleeve with high accuracy.

MODE FOR CARRYING OUT THE INVENTION

Figure 1:
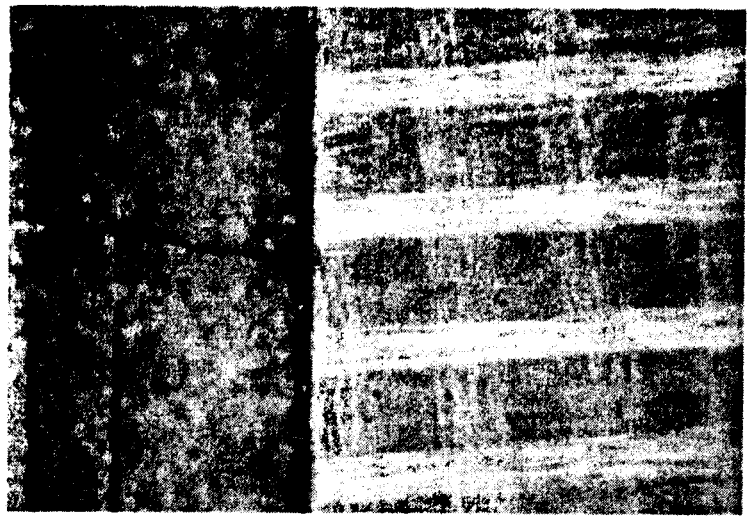
FIG. 1 shows a photograph in which edge parts of a blank printing sleeve for laser engraving cut by laser in Example 1 is photographed from a hollow side of the blank printing sleeve.

Hereinafter, the mode for carrying out the present invention (hereinafter, abbreviated to "the present embodiment") will be described in detail. Here, the present invention is not limited to the following embodiments, and can be practiced within the gist thereof by making various changes and modifications.

[Method for Producing Blank Printing Sleeve for Laser Engraving]

A method for producing a blank printing sleeve for laser engraving according to the present embodiment (hereinafter, the "blank printing sleeve for laser engraving" is written simply as a "blank printing sleeve" and a "printing sleeve for laser engraving" is written simply as a "printing sleeve" in some cases.) comprises the steps of:

(1) laminating a photosensitive resin composition layer (a) on a hollow cylindrical support (b);

(2) photo-curing the laminated photosensitive resin composition layer (a) to form a cured photosensitive resin layer (c); and (3) cutting the hollow cylindrical support (b) and the cured photosensitive resin layer (c) approximately in a circumferential direction of the hollow cylindrical support (b) by a laser cutting method and/or a water beam cutting method.

[Step (1): Laminating Step]

A laminating step at the step (1) is a step of laminating a photosensitive resin composition layer (a) on a hollow cylindrical support (b).

[Photosensitive Resin Composition Layer (a)]

A photosensitive resin composition layer (a) is a layer formed of a photosensitive resin composition (α).

As the photosensitive resin composition layer (a), a sheet-like photosensitive resin composition layer (a) obtained by extrusion molding the photosensitive resin composition (α) into a sheet form can be used. In the case where the sheet-like photosensitive resin composition layer (a) is used, the thickness of the photosensitive resin composition layer (a) is preferably adjusted at the time of extrusion molding.

The laminating step preferably comprises a step of molding the photosensitive resin composition layer (a) in advance, and winding the photosensitive resin composition layer (a) around the hollow cylindrical support (b); a step of welding ends of the photosensitive resin composition layer (a) in a direction approximately parallel to a long axis of the hollow cylindrical support (b) (preferably, in a direction parallel thereto). Molding into a cylindrical form is simply performed by winding the sheet-like photosensitive resin composition layer (a) on the hollow cylindrical support (b) and fixing the sheet-like photosensitive resin composition layer (a) to the hollow cylindrical support (b).

Examples of a method for welding the ends of the photosensitive resin composition layer (a) include a method for layering a photosensitive resin composition layer so that ends thereof may slightly overlap each other, adjusting the thickness of the overlapped portion of the resin by a method such as cutting the overlapped portion of the resin, and pressing a heated jig against the ends.

The photosensitive resin composition layer (a) molded into a sheet form can also be laminated on the hollow cylindrical support (b) through an adhesive layer. In this case, at the step of molding the sheet-like photosensitive resin composition (α), those in which the photosensitive resin composition (α) is laminated on a sheet-like support may be used from the viewpoint of ensuring thickness tolerance.

The sheet-like photosensitive resin composition layer (a) can be obtained by applying the photosensitive resin composition (α) onto a sheet-like support such as a film made of polyethylene terephthalate (PET) or the like.

A sheet-like photosensitive resin composition layer (a) sandwiched between a cover film and a sheet-like support can also be used. Examples of the cover film include a cover sheet subjected to a silicone releasing treatment, and polyolefin films such as polyethylenes and polypropylenes.

The photosensitive resin composition layer (a) can also be laminated by extruding the photosensitive resin composition (α) onto the hollow cylindrical support (b).

As the laminating step, the photosensitive resin composition (α) may be directly extruded and laminated on the hollow cylindrical support. The laminating step may also comprise a step of heating the photosensitive resin composition (α) preferably at not less than 100° C. and not more than 200° C., and more preferably at not less than 120° C. and not more than 180° C., to liquefy the photosensitive resin composition (α); and a step of extruding and laminating the liquid photosensitive resin composition (α) on the hollow cylindrical support (b). In the step of extruding and laminating the photosensitive resin composition (α), the photosensitive resin composition (α) is preferably extruded into a cylindrical form.

The range of a preferable extrusion temperature is preferably not less than 100° C. and not more than 200° C., and more preferably not less than 120° C. and not more than 180° C. At an extrusion temperature in the above-mentioned range, the photosensitive resin composition (α) can be easily extrusion molded without decomposing. Also in the case where the photosensitive resin composition (α) is extruded onto a sheet-like support or the like to form the sheet-like photosensitive resin composition layer (a), a liquid photosensitive resin composition (α) may be directly extruded; or the photosensitive resin composition (α) may be liquefied, and extruded preferably within the above-mentioned range of the extrusion temperature.

In order to form the blank printing sleeve without a seam, a ring extrusion apparatus can also be used to directly mold the photosensitive resin composition (α) into a cylindrical form. Ring extrusion is a method for extruding a molten photosensitive resin composition (α) from a ring-shaped die. For example, the hollow cylindrical support (b) is inserted into the ring-shaped die concentrically, and a surface of the hollow cylindrical support (b) can be cylindrically coated with the photosensitive resin composition (α) while the die or the hollow cylindrical support (b) is moved.

The thickness of the photosensitive resin composition layer (a) is preferably not less than 0.1 mm and not more than 5 mm, more preferably not less than 0.3 mm and not more than 2 mm, and still more preferably not less than 0.5 mm and not more than 1 mm.

At a thickness of the photosensitive resin composition layer (a) within the above-mentioned range, printed matters of high printing quality can be secured. Particularly in the case where the photosensitive resin composition layer (a) is thin, hardness of the blank printing sleeve to be obtained is also increased so that high printing quality can be obtained in application of dry offset printing.

[Photosensitive Resin Composition (α)]

The photosensitive resin composition (α) that forms the photosensitive resin composition layer (a) preferably contains a resin (f) having a number average molecular weight of not less than 1000 and not more than 300,000; and an organic compound (g) having a number average molecular weight of less than 1000 and having a polymerizable unsaturated group in the molecular (hereinafter, simply abbreviated to as an "organic compound (g)" in some cases.).

In the present embodiment, using gel permeation chromatography (GPC), and using a differential refractometer or an ultraviolet and visible spectrophotometer, the number average molecular weight can be determined in terms of a reference sample value of polystyrene whose molecular weight is known.

The photosensitive resin composition (α) may be solid or liquid at 20° C. The photosensitive resin composition that is liquid at 20° C. is suitable in terms of moldability. In the case of a photosensitive resin composition that is solid at 20° C., the solid photosensitive resin composition is preferably a sheet-like molded product whose thickness is adjusted.

In the present embodiment, "liquid" means properties that an object easily flows and deforms, and can be solidified in the deformed shape by cooling.

[Resin (f)]

In the case where the resin (f) is a liquid resin at 20° C., the photosensitive resin composition (α) is also liquid at 20° C.

In the present embodiment, the "liquid resin" means an elastomer having properties that the elastomer deforms by an external force in an instant when the external force is applied thereto and restores the original shape in a short time when the external force is removed.

As the photosensitive resin composition (α) that can obtain high tolerances in thickness and size when the photosensitive resin composition (α) is molded into a cylindrical form, the viscosity thereof at 20° C. is preferably not less than 10 Pa·s and not more than 10 kP·s, and more preferably not less than 50 Pa·s and not more than 5 kP·s.

At a viscosity thereof at 20° C. of not less than 10 Pa·s, it is easy to keep a shape in the case of cylindrical molding, and easy to process. Moreover, the cured photosensitive resin layer (c) to be produced has sufficient mechanical strength. At a viscosity thereof at 20° C. of not more than 10 kP·s, the photosensitive resin composition (α) easily deforms at normal temperature, processing is easy so that the photosensitive resin composition (α) is easily molded into the cylindrical photosensitive resin composition layer (a), and the processing is also simple.

In order to obtain a cylindrical photosensitive resin cured product (c) having particularly high thickness tolerance, the photosensitive resin composition preferably has a relatively high viscosity of preferably not less than 100 Pa·s, more preferably not less than 200 Pa·s, and still more preferably not less than 500 Pa·s to avoid a phenomenon such as dripping of the photosensitive resin composition (α) caused by gravitation when the liquid photosensitive resin composition layer (a) is formed on the hollow cylindrical support (b).

The number average molecular weight of the resin (f) is not less than 1000 and not more than 300,000, preferably not less than 2000 and not more than 150,000, and still more preferably not less than 5000 and not more than 100,000.

At a number average molecular weight of the resin (f) of not less than 1000, the photosensitive resin cured product produced by photo-curing at a subsequent step keeps strength. In the case of use for a base material for printing or the like, the photosensitive resin cured product can withstand repeated use. At a number average molecular weight of the resin (f) of not more than 300,000, the cylindrical photosensitive resin composition layer (a) can be produced easily without excessively increasing the viscosity of the photosensitive resin composition (α) at the time of molding thereof.

The resin (f) may have a polymerizable unsaturated group in the molecular, and examples of a preferable resin (f) include a resin having not less than 0.7 of polymerizable unsaturated groups on average per molecule.

At the number of polymerizable unsaturated groups of not less than 0.7 per molecule on average, the cured photosensitive resin layer (c) has high mechanical strength and high durability, and a blank printing sleeve that can withstand repeated use as a base material for printing can be produced.

Taking mechanical strength of the photosensitive resin cured product into consideration, the polymerizable unsaturated group of the resin (f) is preferably not less than 0.7 per molecule, and an amount exceeding 1 is more preferable. The upper limit of the number of the polymerizable unsaturated group per molecule is not particularly limited. Preferably, the number of the polymerizable unsaturated group per molecule is not more than 20 because contraction at the time of photocuring can be reduced and generation of cracks in the vicinity of the surface or the like can also be suppressed.

In the present embodiment, "in the molecular" also includes the cases where the polymerizable unsaturated group is directly attached to a terminal of the main chain of the resin, a terminal of the side chain of the resin, and the main chain and side chain of the resin.

Examples of the resin (f) include a resin having a skeleton as a polymer shown below.

Examples of the polymer serving as a skeleton include one or more polymers selected from the group consisting of polymers having a hetero atom in the main chain thereof such as polyolefines such as polyethylene and polypropylene; polydiens such as polybutadiene and polyisoprene; polyhaloolefins such as polyvinyl chloride and polyvinylidene chloride; polystyrenes, styrene-butadiene copolymers, styrene-isoprene copolymers, polyacrylonitrile, polyvinyl alcohols, vinyl alcohol-vinyl acetate copolymers, polyvinyl acetals, polyacrylic acids, poly(meth)acrylic acid esters, poly(meth)acrylamides, polyesters, polycarbonates, polyacetals, polyurethanes, polyamides, polyureas, and polyimides.

A plurality of resins as the resin (f) may be a copolymer or a blend.

In the case where a flexible relief image is needed in flexographic printing application, for example, a liquid resin having a glass transition temperature of not more than 20° C., and more preferably a liquid resin having a glass transition temperature of not more than 0° C. can also be added in part as the resin (f). Examples of such a liquid resin include hydrocarbons such as polyethylenes, polybutadienes, hydrogenated polybutadienes, polyisoprenes, and hydrogenated polyisoprenes; polyesters such as adipate and polycaprolactone; polyethers such as polyethylene glycol, polypropylene glycol, and polytetramethylene glycol; silicones such as aliphatic polycarbonates and polydimethylsiloxane; and polymers of (meth)acrylates and/or derivatives thereof, and a mixture and copolymers thereof.

The content of the liquid resin is preferably not less than 30% by weight and not more than 100% by weight based on the entire resin (f). Unsaturated polyurethanes having a polycarbonate structure are preferable from the viewpoint of weatherability.

In application of dry offset printing, a resin having relatively high hardness and resistance to aliphatic hydrocarbon or aromatic hydrocarbon contained in an ink is preferably used. Examples of a preferable resin include polyamides, polyesters, polyurethanes, polycarbonates, polyether polyols, polyvinyl alcohols, and vinyl alcohol-vinyl acetate copolymers. Of these, polycarbonates, polyurethanes, polyamides, polyvinyl alcohols, and vinyl alcohol-vinyl acetate copolymers are preferable.

In the case where the photosensitive resin composition (a) is extrusion molded, while the resin (f) needs to be a thermoplastic resin, a copolymer of styrene with butadiene and/or isoprene is preferable in application of flexographic printing. The copolymer may be a random copolymer or may be a block copolymer.

As a method for introducing a polymerizable unsaturated group into a compound that forms the resin (f), a compound having a polymerizable unsaturated group directly introduced into the molecular terminal or the molecular chain may be used, for example. Examples of an alternative method suitably include a method for reacting a compound having a plurality of reactive groups such as a hydroxyl group, an amino group, an epoxy group, a carboxyl group, an acid anhydride group, a ketone group, a hydrazine residue, an isocyanate group, an isothiocyanate group, a cyclic carbonate group, and an ester group with a binder (for example, polyisocyanate in the case of a hydroxyl group or an amino group) having a plurality of functional groups that can be bonded to the reactive group, adjusting the molecular weight and converting the terminal into a bonding group, and then, reacting the compound obtained by the reaction with a compound having a functional group that reacts with the terminal bonding group of this compound and a polymerizable unsaturated group, thereby to introduce the polymerizable unsaturated group into the terminal.

Moreover, a high thermal decomposable compound is preferably used as the resin (f). For example, $\alpha$-methylstyrene, methacrylic acid ester, acrylic acid ester, and compounds having carbonate bonds, carbamate bonds, or the like in the molecular are known as the high thermal decomposable compound.

[Organic Compound (g)]

An organic compound (g) is a compound having unsaturated bonds involved in a radical polymerization reaction or a ring opening polymerization reaction. Taking easiness of dilution with the resin (f) into consideration, the number average molecular weight of the organic compound (g) is less than 1000. The number average molecular weight of less than 1000 means that the molecular weight is less than 1000 in the case where the molecular structure thereof is established as the organic compound (g).

Examples of the organic compound (g) include olefins such as ethylene, propylene, styrene, and divinylbenzene; acetylenes; (meth)acrylates and derivatives thereof; haloolefins; unsaturated nitriles such as acrylonitrile; (meth)acrylamides and derivatives thereof; allyl compounds such as allyl alcohol and allylisocyanate; unsaturated dicarboxylic acids and derivatives thereof such as maleic acid anhydride, maleic acid, fumaric acid, and itaconic acid; vinyl acetates, N-vinyl pyrrolidone, N-vinylcarbazole, and cyanate esters. From the viewpoint of variety, price, and the like, derivatives of (meth)acrylates and (meth)acrylic acid esters are preferable.

Examples of the above-mentioned derivatives include alicyclic compounds having a functional group such as a cycloalkyl group, a bicycloalkyl group, a cycloalkene group, and a bicycloalkene group; aromatic compounds having a functional group such as a benzyl group, a phenyl group, a phenoxy group, a methyl styryl group, and a styryl group; compounds having a functional group such as an alkyl group, an alkyl halide group, an alkoxyalkyl group, a hydroxyalkyl group, an amino alkyl group, a tetrahydrofurfuryl group, and a glycidyl group; and ester compounds of polyhydric alcohols such as alkylene glycol, polyoxy alkylene glycol, (alkyl/allyloxy) polyalkylene glycol, and trimethylolpropane.

One or more organic compounds (g) having the polymerizable unsaturated group mentioned above can be selected according to the purpose. In order to suppress swelling to an organic solvent such as alcohols and esters, which is a solvent for a printing ink, the organic compound (g) to be used preferably has at least one or more derivatives of long-chain aliphatic compounds, alicyclic compounds, or aromatic compounds, for example.

In order to increase mechanical strength of the cured photosensitive resin layer (c), the organic compound (g) preferably has at least one or more compounds having an alicyclic or aromatic molecular skeleton. In this case, the compound having an alicyclic or aromatic molecular skeleton is preferably not less than 20% by weight and not more than 100% by weight based on the whole amount of the organic compound (g), and more preferably not less than 50% by weight and not more than 100% by weight.

Examples of the organic compound (g) include phenoxy ethyl methacrylate, polypropylene glycol monomethacrylate, trimethylolpropane triacrylate, hexamethylene diacrylate, lauryl methacrylate, 2-ethylhexyldiethyleneglycol monoacrylate, and isoboronyl mono(meth)acrylate.

As a proportion of the resin (f) and the organic compound (g) in the photosensitive resin composition (α), the organic compound (g) is preferably 5 to 200 parts by weight based on 100 parts by weight of the resin (f), and more preferably 20 to 100 parts by weight.

At a proportion of the contained organic compound (g) in the above-mentioned range, mechanical strength as a printing sleeve can be ensured, and pattern forming performance by laser engraving can be ensured.

[Photopolymerization Initiator]

The photosensitive resin composition preferably contains a photopolymerization initiator. Preferably, one or more photopolymerization initiators selected from the group consisting of a hydrogen abstraction-type photopolymerization initiator (h), a disintegration-type photopolymerization initiator (i), and a photopolymerization initiator (j) having a portion that functions as a hydrogen abstraction-type photopolymerization initiator and a portion that functions as a disintegration-type photopolymerization initiator in the same molecular are added into the photosensitive resin composition (a).

[Hydrogen Abstraction-Type Photopolymerization Initiator (h)]

The hydrogen abstraction-type photopolymerization initiator (h) is not particularly limited as long as it is a compound that is through an excitation triplet state, and abstracts hydrogen from a surrounding medium to produce a radical. Aromatic ketone is preferably used. The aromatic ketone is efficiently brought into the excitation triplet state by light excitation. A chemical reaction mechanism is proposed in which this excitation triplet state abstracts hydrogen from the surrounding medium to produce a radical. It is thought that the produced radical is involved in a photo crosslinking reaction.

One hydrogen abstraction-type photopolymerization initiator may used, or a mixture of two or more thereof may be used.

Examples of the aromatic ketone include benzophenones, Michler's ketones, xanthenes, thioxanthones, and anthraquinones.

Benzophenones mean benzophenone or derivatives thereof, and examples thereof include 3,3',4,4'-benzophenone tetracarboxylic acid anhydride and 3,3',4,4'-tetramethoxy benzophenone. Michler's ketones mean Michler's ketone and derivatives thereof. Xanthenes mean xanthene and derivatives obtained by substitution with an alkyl group, a phenyl group, and a halogen group. Thioxanthones mean thioxanthone and derivatives obtained by substitution with an alkyl group, a phenyl group, and a halogen group, and examples thereof include ethylthioxanthone, methylthioxanthone, and chlorothioxanthone. Anthraquinone means anthraquinone and derivatives obtained by substitution with an alkyl group, a phenyl group, a halogen group, or the like.

The amount of the hydrogen abstraction-type photopolymerization initiator (h) to be added is preferably not less than 0.3% by weight and not more than 10% by weight based on the whole amount of the photosensitive resin composition (α), and more preferably not less than 0.5% by weight and not more than 5% by weight.

At an amount of the hydrogen abstraction-type photopolymerization initiator (h) to be added in the above-mentioned range, in the case where the photosensitive resin composition layer (a) is photo-cured in the air, curability of the surface of the cured photosensitive resin layer (c) is sufficiently secured. Weatherability is also secured without cracks being produced at the surface of the cured photosensitive resin layer (c) during long-term preservation.

[Disintegration-Type Photopolymerization Initiator (i)]

The disintegration-type photopolymerization initiator (i) is not particularly limited as long as it is a compound that makes a cleavage reaction in the molecular after absorbing light so that active radicals are produced. Examples thereof include benzoin alkyl ethers, 2,2-dialkoxy-2-phenylacetophenones, acetophenones, acyl oxime esters, azo compounds, organic sulfur compounds, acyl phosphine oxides, and diketones.

One disintegration-type photopolymerization initiator may be used, or a mixture of two or more thereof may be used.

Examples of benzoin alkyl ethers include benzoin isopropyl ether and benzoin isobutyl ether. Examples of 2,2-dialkoxy-2-phenylacetophenones include 2,2-dimethoxy-2-phenylacetophenone and 2,2-diethoxy-2-phenylacetophenone. Examples of acetophenones include acetophenone, trichloroacetophenone, 1-hydroxycyclohexylphenylacetophenone, and 2,2-diethoxyacetophenone. Examples of acyl oxime esters include 1-phenyl-1,2-propanedione-2-(o-benzoyl)oxime. Examples of the azo compounds include azobisisobutyronitrile, diazonium compounds, and tetrazene compounds. Examples of diketones include benzyl and methylbenzoyl formate.

The amount of the disintegration-type photopolymerization initiator (i) to be added is preferably not less than 0.3% by weight and not more than 10% by weight based on the whole amount of the photosensitive resin composition (α), and more preferably not less than 0.5% by weight and not more than 5% by weight.

At an amount of the disintegration-type photopolymerization initiator (i) to be added within the above-mentioned range, in the case where the photosensitive resin composition layer (a) is photo-cured in the air, curability of the inside of the cured photosensitive resin layer (c) can sufficiently be ensured.

[Hydrogen Abstraction-Type and Disintegration-Type Photopolymerization Initiator (j)]

A photopolymerization initiator having a portion that functions as a hydrogen abstraction-type photopolymerization initiator and a portion that functions as a disintegration-type photopolymerization initiator in the same molecular (hereinafter, simply abbreviated to a "photopolymerization initiator (j).") can also be used as the photopolymerization initiator.

Examples of the photopolymerization initiator (j) include α-aminoacetophenones, and examples thereof include 2-methyl-1-(4-methylthiophenyl)-2-morpholino-propan-1-one and 2-benzyl-2-dimethylamino-1-(4-morpholinophenyl)-butanone.

One photopolymerization initiator (j) may be used, or a mixture of two or more thereof may be used.

The amount of the photopolymerization initiator (j) to be added is preferably not less than 0.3% by weight and not more than 10% by weight based on the whole amount of the photosensitive resin composition (α), and more preferably not less than 0.5% by weight and not more than 3% by weight.

At an amount of the photopolymerization initiator (j) to be added within the above-mentioned range, in the case where the photosensitive resin composition layer (a) is photo-cured in the air, mechanical properties of the cured photosensitive resin layer (c) can be sufficiently secured.

[Particulates]

Particulates selected from the group consisting of inorganic particulates, organic particulates, and organic inorganic complex particulates can be added to the photosensitive resin composition (α).

Addition of the particulates enables improvement in mechanical properties of the cured photosensitive resin layer (c), improvement in wettability of a surface of the cured photosensitive resin layer (c), and adjustment of viscosity of the photosensitive resin composition (α), adjustment of the viscoelasticity of the cured photosensitive resin layer (c), and the like.

As the particulates, one kind of particulates may be used alone, or a mixture of two or more kinds thereof may be used.

The material of the inorganic particulates or the organic particulates is not particularly limited, and known particulates can be used. Moreover, examples of the organic inorganic complex particulates include particulates in which an organic layer or organic particulates are formed on the surface of inorganic particulates, or particulates in which an inorganic layer or inorganic particulates are formed on the surface of organic particulates.

Inorganic particulates having high rigidity such as silicon nitride, boron nitride, and silicon carbide, or organic particulates such as polyimides can be used in order to improve mechanical properties of the cured photosensitive resin layer (c). Inorganic particulates and organic particulates made of a material having good swelling properties to a solvent to be used can also be added in order to improve solvent resistance of the cured photosensitive resin layer (c). Inorganic porous particulates having excellent properties of adsorbing and removing a viscous liquid residue produced at the time of laser engraving can also be added in order to form a pattern on the surface of the cured photosensitive resin layer (c) by laser engraving.

The inorganic porous particulates are not particularly limited, and for example, examples thereof include porous silica, mesoporous silica, silica-zirconia porous gel, porous alumina, and porous glass.

The number average particle size of the particulates is preferably 0.01 to 100 μm.

In the case where the particulates having the number average particle size within the above-mentioned range are used, no inconvenience such as increase in viscosity, containing of bubbles, and occurrence of a large amount of dust is produced when the particulates are mixed with the resin (f) and the organic compound (g), and no reliefs and projections are produced on the surface of the cured photosensitive resin layer (c).

The average particle size of the particulates is more preferably 0.1 to 20 μm, and still more preferably 1 to 10 μm.

In the present embodiment, the average particle size of the particulates can be measured using a laser scattering type particle size distribution measuring apparatus.

The form of a particle for the particulates is not particularly limited, and a spherical particle, a flat particle, a needle-like particle, an amorphous particle, or a particle having a projection on the surface thereof can be used. From the viewpoint of abrasion resistance, a spherical particle is particularly preferable.

A particle can also be used, in which the surface of the particulate is coated with a silane coupling agent, a titanium coupling agent, or other organic compound, and is subjected to surface modification treatment to increase hydrophilicity or hydrophobicity.

A proportion of the particulates of the photosensitive resin composition (α) is preferably 1 to 100 parts by weight based on 100 parts by weight of the resin (f), more preferably 2 to 50 parts by weight, and still more preferably 2 to 20 parts by weight.

At a proportion of the particulates to be contained within the above-mentioned range, a large amount of liquid engraved chippings produced at the time of laser engraving can be sufficiently removed.

According to application or a purpose, a polymerization inhibitor, a stabilizer, an ultraviolet absorbing agent, a lubricant, a surface active agent, a plasticizer, and a flavor, and other additives can be added to the photosensitive resin composition (α).

[Hollow Cylindrical Support (b)]

A hollow cylindrical support (b) is not particularly limited, and examples thereof include a hollow cylindrical support made of a metal or a fiber reinforced plastic.

As a preferable material, examples of metals include nickel, iron, and aluminum. Of these, a nickel hollow cylindrical support produced by a plating method is preferable.

From the viewpoint of a balance among mechanical strength, safety during handling, durability, repeating attaching/detaching properties, and easiness in cutting, the hollow cylindrical support (b) is preferably made of a fiber reinforced plastic.

As the fiber reinforced plastic, those containing at least one selected from glass fibers, polyamide fibers, polyimide fibers, polyester fibers, polyurethane fibers, cellulose fibers, carbon fibers, metallic fibers, and ceramic fibers, for example, are preferable. From the viewpoint of availability, glass fibers are a preferable material. From the viewpoint of lightweightness, organic fibers such as polyamide fibers, polyimide fibers, polyester fibers, polyurethane fibers, and cellulose fibers, and carbon fibers are a preferable material. From the viewpoint of durability, carbon fibers, polyamide fibers, and ceramic fibers are a preferable material.

The thickness of the hollow cylindrical support (b) is preferably not less than 0.1 mm and not more than 1.5 mm.

In the case where the hollow cylindrical support (b) is made of a metal, the thickness of the hollow cylindrical support (b) is more preferably not less than 0.1 mm and not more than 0.3 mm, and still more preferably not less than 0.1 mm and not more than 0.2 mm.

A diameter of a hollow portion in the hollow cylindrical support (b) is preferably not less than 95 mm and not more than 480 mm. The diameter thereof is more preferably not less than 180 mm and not more than 300 mm, and still more preferably not less than 200 mm and not more than 250 mm.

In the case where the hollow cylindrical support (b) is made of a fiber reinforced plastic, the diameter thereof is more preferably not less than 0.3 mm and not more than 0.8 mm, and still more preferably not less than 0.4 mm and not more than 0.6 mm.

At a thickness of the hollow cylindrical support (b) within the above-mentioned range, handling is easy, attachment to and detachment from a printing cylinder at the time of printing are easy, and durability in repeated use is provided. Of these, in the case where the hollow cylindrical support (b) is made of a fiber reinforced plastic, by using a hollow cylindrical support (b) having a thickness of not more than 0.8 mm, the hollow cylindrical support (b) can be detached easily only by applying air pressure to an air cylinder.

The length of the hollow cylindrical support (b) is preferably not less than 1000 mm and not more than 4000 mm, more preferably not less than 1500 mm and not more than 3000 mm, and still more preferably not less than 1500 mm and not more than 2700 mm.

[Method for Molding Photosensitive Resin Composition into a Cylindrical Shape]

An existing method for molding resin can be used for a method for molding the photosensitive resin composition (α) into a cylindrical shape. Examples thereof include a casting method, a method for extruding a resin from a nozzle or a die with a machine such as a pump and an extruder to adjust a thickness with a blade, a method for calendering with a roll to adjust a thickness, and a method for spraying using a spray or the like. At that time, the photosensitive resin composition can also be molded while the photosensitive resin composition is heated in the range that the photosensitive resin composition is not thermally decomposed. Rolling treatment, grinding treatment, and the like may be performed when necessary.

Adhesiveness to the photosensitive resin composition layer (a) or an adhesive layer can be improved by performing physical or chemical treatment on the surface of the hollow cylindrical support (b). Examples of a method for physical treatment include a sandblasting method, a wet blasting that ejects a liquid containing particulates, a corona discharge treatment method, a plasma treatment method, and a method for irradiating with ultraviolet rays or vacuum ultraviolet rays. Examples of a method for chemical treatment include a strong acid or strong alkali treatment method, an oxidizer treatment method, and a coupling agent treatment method.

[Step (2): Curing Step]

A curing step of step (2) is a step of photo-curing the laminated photosensitive resin composition layer (a) to form a cured photosensitive resin layer (c).

[Cured Photosensitive Resin Layer (c)]

The photosensitive resin composition layer (a) is irradiated with light and cured to form the cured photosensitive resin layer (c).

Shore D hardness of the cured photosensitive resin layer (c) is preferably not less than 20° and not more than 100°, more preferably not less than 30°, still more preferably not less than 40°, and further still more preferably not less than 50°. The Shore D hardness thereof is more preferably not more than 90°, and still more preferably not more than 80°.

While a slightly lower Shore D hardness is preferable in flexographic printing, a higher Shore D hardness is preferable in dry offset printing and gravure printing.

At a Shore D hardness within the above-mentioned range, high printing accuracy can be obtained in any of the printing methods. At a Shore D hardness within the above-mentioned range, preferably, the photosensitive resin composition layer (a) is laminated on the hollow cylindrical support (b), and photo-cured.

The Shore D hardness can be measured using a durometer according to specification of JIS K 7215D. Specifically, using a durometer ("GS-702N TYPE D" made by Teclock Corporation, Japan, and a JIS constant pressure load instrument ("GS-710" made by Teclock Corporation, Japan), the Shore D hardness can be measured.

The thickness of the cured photosensitive resin layer (c) is preferably not less than 0.1 mm and not more than 5 mm, more preferably not less than 0.3 mm and not more than 2 mm, and still more preferably not less than 0.5 mm and not more than 1 mm.

At a thickness of the cured photosensitive resin layer (c) within the above-mentioned range, printed matters having sufficient printing quality can be obtained in a printing step.

In the present embodiment, data of thermogravimetric analysis obtained by measuring weight loss at the time of heating a sample in an inert gas atmosphere can be used as an index of thermal decomposability of the cured photosensitive resin layer (c).

The resin (f) is preferably used in the photosensitive resin composition (α) so that the temperature at a point of time when the weight of the cured photosensitive resin layer (c) is decreased to half is preferably not less than 150° C. and not more than 450° C., more preferably not less than 250° C. and not more than 400° C., and still more preferably not less than 250° C. and not more than 380° C.

Moreover, a resin (f) that thermally decomposes in a narrow range of a temperature is preferable. As the index, in the thermogravimetric analysis, a difference between the temperature at which the weight reduces to 80% of an initial weight and the temperature at which the weight reduces to 20% of the initial weight is preferably not more than 100° C., more preferably not more than 80° C., and still more preferably not more than 60° C.

[Photo-Curing]

The photosensitive resin composition layer (a) is crosslinked by irradiation with light to form the cured photosensitive resin layer (c). The photosensitive resin composition layer (a) can also be crosslinked by irradiation with light while the photosensitive resin composition layer (a) is molded.

Examples of the light include ultraviolet rays, visible rays, and high energy beams such as electron beams and X-rays.

Examples of the light source used for photo-curing include high pressure mercury vapor lamps, ultrahigh pressure mercury lamps, ultraviolet fluorescence lamps, germicidal lamps, carbon arc lamps, xenon lamps, and metal halide lamps.

The light with which the photosensitive resin composition layer (a) is irradiated preferably has light with a wavelength of 200 to 300 nm. The hydrogen abstraction-type photopolymerization initiators (h) often have strong optical absorption in this wavelength region. For that reason, in the case where the irradiated light has light with a wavelength of 200 to 300 nm, curability of the surface of the cured photosensitive resin layer (c) can sufficiently be ensured. One light source used for photo-curing may be used alone, or two or more light sources may be used because curability of the resin may be improved by curing the resin using two or more light sources having different wavelengths.

[Cutting, Grinding, Polishing Steps]

After the photosensitive resin composition layer (a) is photo-cured to form a cured photosensitive resin layer (c), the surface of the blank printing sleeve can be adjusted at steps of cutting, grinding, and polishing the surface thereof. These steps can further improve thickness tolerance of the printing sleeve.

[Adhesive Layer]

An adhesive layer may be provided between the hollow cylindrical support (b) and the cured photosensitive resin layer (c). The adhesives layer is not particularly limited unless any problem such as peeling occurs in the printing sleeve during the printing step. Examples thereof include a layer formed by laminating an adhesive containing a photosensitive resin, a thermosetting resin, or an anaerobic resin. The adhesive layer may be a binding material layer molded into a sheet form. From the viewpoint of handling, a double-sided adhesive tape molded into a sheet form can also be used as the adhesive layer.

[Cushion Layer]

A cushion layer made of an elastomer can also be formed in the lower part of the cured photosensitive resin layer (c). In the case where the cushion layer and the adhesive layer are provided, the adhesive layer may be provided between the cushion layer and the hollow cylindrical support (b).

The cushion layer is not particularly limited as long as it is a resin composition having rubber elasticity such as thermoplastic elastomers, photo-curable elastomers, and thermosetting elastomers, for example. From the viewpoint of processability into a sheet form or a printing sleeve, use of a photocurable liquid photosensitive resin composition and use of a material elastomerized after curing are simple and preferable. The cushion layers may also be sulfur crosslinking type rubbers, organic peroxides, phenol resin initial condensates, quinonedioxime, metal oxides, and non-sulfur crosslinking type rubbers using a compound such as thiourea as a crosslinking agent.

Further, a telechelic liquid rubber elastomerized by three-dimensionally crosslinking the telechelic liquid rubber using a curing agent that reacts therewith can also be used.

The cushion layer may also be a cushion layer made of foaming polyurethane, foaming polyethylene foam, and the like having closed or open cells within the layer. Commercially available cushioning materials and cushion tapes can also be used. Moreover, an adhesive or a gluing agent may be applied to one or both sides of the cushion layer.

By forming a modifying layer on the surface of the cured photosensitive resin layer (c), tackiness of the surface of the printing substrate can be reduced and ink wettability can be improved. Examples of the modifying layer can include a coating treated with a compound that reacts with a surface hydroxyl group of a silane coupling agent or a titanium coupling agent, or a polymer film containing porous inorganic particles.

[Step (3): Cutting Step]

A cutting step of step (3) is a step of cutting the hollow cylindrical support (b) and the cured photosensitive resin layer (c) by a laser cutting method and/or a water beam cutting method approximately in a circumferential direction of the hollow cylindrical support (b).

At the cutting step, the cured photosensitive resin layer (c) and the hollow cylindrical support (b) are preferably cut at the same position approximately in the circumferential direction of the hollow cylindrical support (b).

In order to cut the cured photosensitive resin layer (c) and the hollow cylindrical support (b) at the same position, preferably, the cured photosensitive resin layer (c) and the hollow cylindrical support (b) are cut simultaneously in the state where the cured photosensitive resin layer (c) is laminated on the hollow cylindrical support (b). More preferably, the photosensitive resin composition layer (a) laminated on the hollow cylindrical support (b) is photo-cured to form the cured photosensitive resin layer (c), and then, the hollow cylindrical support (b) and the cured photosensitive resin layer (c) are cut simultaneously without moving cured photosensitive resin layer (c) on the hollow cylindrical support (b).

At the cutting step, the hollow cylindrical support (b) may be cut while the hollow cylindrical support (b) is rotated approximately in the circumferential direction thereof. The hollow cylindrical support (b) is preferably rotated in the circumferential direction around the long axis of the hollow cylindrical support (b) as an axis of rotation.

In the present embodiment, the long axis of the hollow cylindrical support (b) is an axis for rotating the hollow cylindrical support (b) in the circumferential direction. Preferably, the hollow cylindrical support (b) rotates in the state that the hollow cylindrical support (b) is attached to a cylindrical support (d) and a cylindrical support (e) such as a cylinder attached to the axis of rotation. By rotation in the circumferential direction around the long axis as the axis of rotation, easy and accurate cutting is possible.

Preferably, the cutting step further comprises a step of forming a notch (cut) for registration in the formed cut portion. The notch formed in an end of the blank printing sleeve plays an extremely large role in an registration process in the subsequent laser engraving step and printing step. At the printing step, polychromic printing is carried out using a printing sleeve corresponding to each color. Accordingly, an image position in the printing sleeve corresponding to each color needs to be aligned with high accuracy. Preferably, a laser engraving apparatus and a printing apparatus have a mechanism that can attach and detach the blank printing sleeve and the printing sleeve without detaching the cylinder from the apparatus when the blank printing sleeve and the printing sleeve are attached to and detached from the cylinder. For example, a cantilever holding mechanism that holds one side of the cylinder is preferably used. Accuracy of position can be significantly improved by aligning the notch formed in an end of the blank printing sleeve with a pin for registration attached to the surface of the cylinder.

Especially, the notch is preferably formed on approximately a straight line of the long axial direction of the hollow cylindrical support (b) corresponding to a position of a welded end in the case of using a laminating method for winding the sheet-like photosensitive resin composition (α) around the hollow cylindrical support (b), and welding ends of the photosensitive resin composition (α) approximately parallel to the long axis of the hollow cylindrical support (b). The welded ends of the sheet-like photosensitive resin composition (α) is slightly depressed with respect to other portions. For that reason, thickness tolerance of the blank printing sleeve produced by cutting can be at the same level on the basis of the notch position.

In the case where the cured photosensitive resin layer (c) has a defective portion, the notch is preferably formed so that the defective portion may be included in a relief formed by laser engraving. For example, the defective portion is marked, and the notch is formed before an image forming step so that the position of the defective portion may be aligned with a portion engraved by a depth of not less than 0.3 mm at the image forming step by laser engraving. Thereby, a defective portion as the printing sleeve after an image is formed can be prevented. Even if the defective portion exists, formation of the notch in an appropriate position can remove the defective portion by laser engraving. Accordingly, the blank printing sleeve can be produced with good production yield.

In the present embodiment, examples of the "defective portion" can include bubbles, scratches, foreign substances, and dents.

[Apparatus for Producing Blank Printing Sleeve for Laser Engraving]

An apparatus for producing a blank printing sleeve for laser engraving according to the present embodiment is an apparatus for producing the blank printing sleeve for laser engraving including: at least one cutting mechanism selected form a laser cutting mechanism and a water beam cutting mechanism, a cylindrical support that fixes a hollow cylindrical support (b), and a holding mechanism that can rotate the cylindrical support, wherein the laser cutting mechanism and/ or the water beam cutting mechanism have a mechanism for changing a position of a laser beam and/or a water beam is changed, and/or a mechanism for scanning.

[Cylindrical Support (d)]

In the apparatus according to the present embodiment, a cylindrical support (d) preferably has a mechanism for allowing change in the outer diameter thereof from the viewpoint of easy attachment and detachment of the hollow cylindrical support. The production method according to the present embodiment preferably comprises a step of changing the outer diameter of the cylindrical support (d) to be smaller than inner diameter of the hollow cylindrical support (b) after the cutting step (3). When the cylindrical support (d) has the mechanism for allowing change in the outer diameter thereof, the cut blank printing sleeve can be easily extracted. As a contracting and expanding mechanism for allowing change in the outline, a mechanism for introducing a gas into the inside of the cylindrical support and leak the gas, or a core bar described in Japanese Utility Model Laid-Open No. 06-46894 can be used. In the case where a cylindrical support having high accuracy of a central axis is necessary, the core bar is preferably used.

Examples of the mechanism for changing the outer diameter can include a mechanism having a circular metallic plate or a cylindrical elastomer layer in an outermost periphery around an expandable skeleton of a metal, and a mechanism having an expandable elastomer layer in a periphery. The elastomer layer is preferably made of a material having high heat resistance such as urethane rubbers and silicone rubbers. As a heat resistance index of the material used for the elastomer layer, a temperature at 50% weight loss is preferably not less than 400° C. under in an inert gas atmosphere in the thermogravimetric analysis. Presence of a protective layer in the surface of the cylindrical support (d) is preferable from the viewpoint of reducing damage by a laser beam at the cutting processing or the notch processing. The protective layer is preferably a protective layer containing at least one metal selected from the group consisting of chromium, tungsten, tantalum, and titanium and/or a metal oxide thereof.

[Cylindrical Support (e)]

The apparatus according to the present embodiment preferably has a cylindrical support (e) for rotating the hollow cylindrical support (b). In the method and the apparatus used for the production method having the step of cutting using a high energy beam called a laser, the cylindrical support (e) is preferably a metallic cylinder from the viewpoint of durability. In the case where the step cutting by a laser is included, when cutting of the hollow cylindrical support (b) by the laser is completed, the laser focuses on the surface of the cylindrical support (e) installed under the hollow cylindrical support (b) to damage the surface thereof. For this reason, from the viewpoint of defocusing of the laser, a circular groove having a depth of not less than 0.5 mm is preferably formed in the cut portion. More preferably, the depth thereof is not less than 1 mm, and still more preferably not less than 5 mm. The apparatus according to the present embodiment can also have a mechanism for cooling the cut portion during laser cutting. For example, a production apparatus and a production method having a mechanism and a step of spraying a cold air from a jig to the cut portion using an adiabatic expansion phenomenon at the time of blowing off a compressed air, circulating a refrigerant within a metallic cylinder, or performing thermoelectric cooling using a semiconductor Peltier device are also enabled. The cylindrical support (e) is preferably an air cylinder having a small hole through which the air is ejected from the viewpoint of easy attachment and detachment. More preferably, the surface of the air cylinder has a plurality of air-lock type small holes for air ejection each having a spherical object within the small hole. Still more preferably, the surface of the cylinder has a protective layer made of a metal selected from chromium, tungsten, tantalum, and titanium, and/or an oxide thereof.

[Cutting Mechanism]

A method used for the cutting step is a laser cutting method and/or a water beam cutting method. Moreover, the apparatus according to the present embodiment has at least one cutting mechanism selected from a laser cutting mechanism and a water beam (high pressure water) cutting mechanism.

It is found out that according to the cutting step in the present embodiment, a very fine cut portion of the cured photosensitive resin layer (c) can be obtained by cutting. Also in the case where the hollow cylindrical support (b) is made of a fiber reinforced plastic, a fine cut portion can be obtained by cutting, and an edge part can also be processed very sharply.

The notch (cut) for registration can be formed in the formed cut portion at the cutting step. Especially, in the case of the laser cutting method, the notch for registration can be formed in the formed cut portion with a laser beam and/or a water beam, and cutting and notch formation can be performed at one time. The shape of the notch is not particularly limited, and examples thereof include a semicircular shape and a polygonal shape.

[Laser Cutting Method and Laser Cutting Mechanism]

A laser cutting method and a laser cutting mechanism are a method and a mechanism of irradiating a blank printing sleeve with a laser, and cutting the blank printing sleeve from the surface in the depth direction thereof. Thereby, the cured photosensitive resin layer (c) and the hollow cylindrical support (b) are cut. The kind of a laser used for cutting is not particularly limited. Preferably, the cured photosensitive resin layer (c) and the hollow cylindrical support (c) have light absorption at a wavelength of the laser to be used.

Examples of the laser include infrared lasers having an oscillation wavelength of not less than 5 μm and not more than 20 μm, or ultraviolet lasers having a wavelength of not less than 150 nm and not more than 400 nm.

Of the infrared lasers, a carbon dioxide gas laser is preferable. Examples of the ultraviolet lasers include a YAG laser, a $YVO_4$ laser, the third harmonic, fourth higher harmonic, and fifth higher harmonic of a fiber laser doped with a rare earth element such as Er and Yb, and an excimer laser.

In the case where the cured photosensitive resin layer (c) and the hollow cylindrical support (b) contain a dye and a pigment that absorb a near-infrared laser, the near-infrared laser can also be used. The laser may be a continuous oscillation laser, or may be a pulse oscillation laser. The diameter of the laser beam is preferably not less than 0.01 mm and not more than 1 mm. Laser energy that can be supplied can be increased by narrowing the diameter of the laser beam within the above-mentioned range using an optical system. Accordingly, an average output is preferably not more than 100 W, more preferably not more than 0.5 W, still more preferably not less than 1 W and not more than 60 W, and further still more preferably not less than 5 W and not more than 50 W. The width of the blank printing sleeve to be produced can be processed with high tolerance in size by narrowing the diameter of the laser beam. An edge of the cut portion of the photosensitive resin composition (c) and the hollow cylindrical support (b) can also be processed without relief and projection.

The laser cutting mechanism has a mechanism for changing the position of the laser beam and/or a mechanism for scanning. A notch having a complicated shape can be processed by fixing the hollow cylindrical support and scanning the hollow cylindrical support with the laser beam. A galvanomirror or a polygon mirror is preferably used in a method for scanning with the laser beam. Particularly, use of two galvanomirrors enables scanning with the laser beam in the two-dimensional direction.

[Water Beam Cutting Method and Water Beam Cutting Mechanism]

A water beam cutting method and a water beam cutting mechanism are a method and a mechanism of cutting using a water beam (high pressure water) ejected from a nozzle having a small diameter. The diameter of the water beam ejected from the nozzle is preferably not less than 0.05 mm and not more than 2 mm, and more preferably not less than 0.5 mm and not more than 1 mm. A diameter of the water beam diameter within the above-mentioned range can ensure sufficient power that can be used for the cutting step and tolerance in size of the processed blank printing sleeve. Because water is used, it is unnecessary to cool in particular. A water pressure is preferably not less than 50 MPa and not more than 450 MPa, more preferably not less than 200 MPa and not more than 400 MPa, and still more preferably not less than 300 MPa and not more than 400 MPa. At a water pressure within the above-mentioned range, it is possible to perform cut processing on the edge of the cut portion without reliefs and projections.

The water beam cutting mechanism has a mechanism for changing the position of the water beam and/or a mechanism for scanning. By fixing the hollow cylindrical support and scanning the hollow cylindrical support with the water beam, a notch having a complicated shape can be processed by scanning with the water beam in the two-dimensional direction.

Examples of the mechanism for changing the position of the laser beam and the mechanism for changing the position of the water beam include a mechanism for rotating the hollow cylindrical support (b). Such a mechanism can rotate the hollow cylindrical support (b) to change the position of the laser beam or the water beam.

A combination of the laser cutting mechanism and the water beam cutting mechanism can also be used. Moreover, the laser can be passed through the center of the water beam whose beam diameter is narrowed. For example, as a commercially available apparatus, "Ultra Fine Cool Laser Processing Machine WbM" made by Sugino Machine Limited can be also acquired and used.

[Blank Printing Sleeve Produced by Cutting]

The width of the blank printing sleeve produced by cutting is preferably not less than 100 mm and not more than 500 mm, more preferably not less than 100 mm and not more than 300 mm, and still more preferably not less than 100 mm and not more than 200 mm.

As a cutting width is narrower, the number of blank printing sleeves that can be cut from a long blank printing sleeve is larger. At a step of producing the blank printing sleeve, a cylindrical support such as a metallic cylinder at the time of holding the hollow cylindrical support (b) is needed. In the case where the length of the hollow cylindrical support (b) exceeds 5 m and is long, sag occurs in a central portion due to a self weight of the cylindrical support (d), therefore causing difficulties in high-accuracy processing. This phenomenon is more remarkable as the outline of the cylindrical support is smaller. In the flexographic printing and the dry offset printing, in the case where many kinds of colors are used, printing is performed by using inks of eight to ten colors. Accordingly, at a width of the blank printing sleeve produced within the above-mentioned range, eight to ten blank printing sleeves can be produced by producing a blank printing sleeve using one long hollow cylindrical support (b), and cutting this blank printing sleeve. Printing can be performed using blank printing sleeves having the same accuracy in printing using eight to ten colors, and also having an extremely small fluctuation of thickness tolerance among the blank printing sleeves, so that high printing quality can be obtained. The blank printing sleeve having high accuracy of the edge part of the blank printing sleeve can also be obtained.

The outer circumferential length of the blank printing sleeve is preferably not less than 300 mm and not more than 1500 mm, more preferably not less than 300 mm and not more than 800 mm, and still more preferably not less than 450 mm and not more than 750 mm.

At an outer circumferential length within the above-mentioned range, even if one long hollow cylindrical support (b) is used, a blank printing sleeve with high accuracy can be produced by cutting.

[Method for Producing Printing Sleeve]
[Laser Engraving and Laser Engraving Mechanism]

In the present embodiment, laser engraving is a method for using digital data of an image to be formed on the cured photosensitive resin layer (c), and operating a laser apparatus using a computer to create a relief image on a printing substrate. The apparatus according to the present embodiment preferably has a laser engraving mechanism used for the laser engraving. Any laser may be used as the laser used for laser engraving as long as the laser includes a wavelength at which the blank printing sleeve has absorption. For engraving at high speed, a high-output laser is preferable, and examples thereof include infrared lasers and infrared emitting solid state lasers such as carbon dioxide gas lasers, YAG lasers, and semiconductor lasers. The second higher harmonic of a YAG laser having an oscillation wavelength in the visible ray region, copper vapor lasers, ultraviolet lasers having an oscillation wavelength in the ultraviolet region such as excimer lasers, YAG lasers having a wavelength converted to the third or fourth higher harmonic enable abrasion processing to cut bonds of organic molecules, and are suitable for micro processing.

The laser may be a continuous irradiation type, or may be a pulse irradiation type.

Engraving by the laser is performed under an oxygen containing gas, usually in the presence of air or an air stream, and can be performed also under a carbon dioxide gas or a nitrogen gas. After engraving is completed, powdered or liquid substances slightly produced in the surface of the relief printing sleeve may be removed using an appropriate method, such as a method for washing the surface of the relief printing sleeve with water containing a solvent or a surface active agent, or the like, a method for spraying a water based cleaning agent onto the surface of the relief printing sleeve with a high voltage spray or the like, and a method for spraying a high voltage steam onto the surface of the relief printing sleeve.

In the present embodiment, after engraving in which a relief pattern is formed by irradiation with a laser beam, followed by the step of removing powdered or viscous liquid chippings that remain on the surface of the sleeve, postexposure in which the surface of the printing sleeve having the formed pattern is irradiated with light at a wavelength of 200 nm to 450 nm can also be performed. Postexposure is a method that is effective in removal of surface tackiness. Postexposure may be performed in any environment of in the air, in an inert gas atmosphere, and in water. It is particularly effective in the case where the hydrogen abstraction-type photopolymerization initiator (h) is contained in the photosensitive resin composition (α) to be used. Before the postexposure step, the surface of the printing sleeve may be treated with a treatment solution containing the hydrogen abstraction-type photopolymerization initiator (h), and exposed. Moreover, the printing sleeve may be exposed while the printing sleeve is immersed in the treatment solution containing the hydrogen abstraction-type photopolymerization initiator (h).

[Application]

Examples of application of the printing sleeve produced according to the present embodiment include flexographic printing, dry offset printing, and gravure printing.

Of these, the flexographic printing in narrow webs such as label printing for which use of a printing sleeve having a narrow width is suitable, and the dry offset printing in curved surface printing such as can printing and tube printing are preferable application.

EXAMPLES

Hereinafter, the present embodiment will be described more specifically by way of Examples and Comparative Examples, but the present embodiment is not limited to the following Examples. Measuring methods used for the present embodiment are as follows. A method for cutting a blank printing sleeve used in the present embodiment and a method for engraving the blank printing sleeve are as follows.

(1) Laser Cutting and Laser Engraving

Laser cutting and laser engraving were performed using a carbon dioxide gas laser engraving machine (Agrios, made by Stork Prints BV, Austria, provided with a carbon dioxide gas laser having an output of 500 W, oscillation wavelength of the laser of 10.6 µm). The diameter of the laser beam was approximately 25 µm. However, in laser cutting, the carbon dioxide gas laser was used on a condition of an output of 50 W.

A blank printing sleeve was attached to an air cylinder in which a groove having a width of 2 mm and a depth of 2 mm was formed in the circumferential direction thereof. The blank printing sleeve was cut by the laser at a position on the groove.

A halftone dot (120 lines/inch, area rate of 10%) pattern was created, and laser engraving was performed at an engraving depth of 0.5 mm.

(2) Water Beam Cutting

Water beam cutting was performed using a Servo Jet Pump and an Aqua-head (made by Sugino Machine Limited, Japan) at a water pressure of 340 MPa and with a water beam having a beam diameter of 1 mm.

(3) Cutting by a Cutter

Cutting by cutter was performed by using a rotary cutter and attaching a rotary cutter having a thickness of 0.5 mm to a long tube cutting apparatus (made TECHNO GIKEN CO., LTD., Japan).

(4) Measurement of Viscosity

Viscosity of a photosensitive resin composition was measured at 20° C. using a B type viscometer (made by TOKYO KEIKI INC., Japan, a B8H type).

(5) Measurement of Number Average Molecular Weight

Using a gel permeation chromatograph method (a GPC method), the number average molecular weight of the resin (f) and that of the organic compound (g) were measured in terms of polystyrene whose molecular weight was known (made by TOSOH CORP., Japan, "TSK standard polystyrene").

A high-speed GPC apparatus (made by TOSOH CORP., Japan, HLC-8020) and a polystyrene packed column (made by TOSOH CORP., Japan, TSKgel GMHXL) were used, and tetrahydrofuran (THF) was used as a developing solvent. The temperature of the column was set at 40° C.

As a sample injected into the GPC apparatus, a THF solution having a sample concentration of 1% by mass was prepared. The amount of the THF solution to be injected was 10 µL. A differential refractometer was used as a detector.

(6) Measurement of Surface Roughness

Using a surface roughness measuring instrument "SE500" by Kosaka Laboratory, Ltd., measurement was performed on conditions of a stylus R (radius of curvature) of 2 µm, cut-off $\lambda c=0.8$ mm, a measurement length of 4 mm, and a feeding speed of 0.5 m/second to measure a center line average surface roughness Ra.

Production Example 1

To a 1-L separable flask provided with a thermometer, a stirring machine, and a reflux apparatus, 447.24 g of polycarbonatediol (made by Asahi Kasei Chemicals Corporation, Japan, PCDL® L4672 (number average molecular weight of 1990, OH value of 56.4)) and 30.83 g of tolylene diisocyanate were added, and were reacted at 80° C. under heating for approximately 3 hours. Then, 14.83 g of 2-methacryloyloxy isocyanate was added, and further reacted for approximately 3 hours to produce a resin (A) whose terminal was a methaacrylic group.

The obtained resin (A) was starch syrup-like at 20° C., and flowed when an external force was applied thereto. And even when the external force removed, the resin (A) did not restore the original shape. In the resin (A), the number of polymerizable unsaturated groups in the molecular was an average of approximately two per molecule, and the number average molecular weight was approximately 10000.

Example 1

An amount of 70 parts by weight of the resin (A) produced in Production Example 1 as the resin (f), 10 parts by weight of phenoxy ethyl methacrylate (molecular weight of 190) and 10 parts by weight of polypropylene glycol monomethacrylate (molecular weight of 400) as the organic compound (g), 5 parts by weight of porous impalpable powder silica (made by Fuji Silysia Chemical Ltd., Japan, Sylosphere® C-1504, number average particle size of 4.5 µm, specific surface of 520 $m^2$/g, average pore size of 12 nm, pore volume of 1.5 mL/g, loss on initiator of 2.5% by weight, oil absorption of 290 mL/100 g, hereinafter, referred to as "C-1504" in some cases.) as the particulates, 0.5 parts by weight of benzophenone and 0.6 parts by weight of 2,2-dimethoxy-2-phenylacetophenone as the photopolymerization initiator, and 0.5 parts by weight of 2,6-di-t-butyl acetophenone (made by JAPAN CHEMTECH LTD., Japan, "IONOL® CP") as a stabilizer were mixed to prepare a photosensitive resin composition.

The obtained photosensitive resin composition was liquid at 20° C. The viscosity measured by the method (4) mentioned above was 1200 Pa·s.

The photosensitive resin composition was laminated on a hollow cylindrical support so as to have a thickness of 0.5 mm, the hollow cylindrical support being made of an epoxy resin reinforced with glass fibers, and having a thickness of 0.6 mm, an inner diameter of 226.12 mm, and a width of 1800 mm (made by Polywest Kunststofftechnik Sauressig & Partner GmbH & Co. KG), to which a photo-curable adhesive (made by Notepu Kogyo K. K., Japan, ACRYTACK® T-1050) was applied at a thickness of 0.1 mm. Using a metal halide lamp (made by Fusion UV Systems, Inc., USA, F450V type UV lamp) as a light source, the photosensitive resin composition layer was exposed on a condition of 4000 mJ/cm² at 350 nm to form a cured photosensitive resin layer. The surface of the produced cured photosensitive resin layer was rotated at a high speed, and ground and polished to adjust the thickness of the blank printing sleeve at 0.92 mm and the surface roughness Ra at 0.5 μm. The thickness in the circumferential direction of the hollow cylindrical support was measured at ten points in the width direction thereof. Then, the range of fluctuation in the thickness fell within 30 μm.

The produced blank printing sleeve having a width of 1800 mm was attached to a cylindrical support whose outline could be changed (made by TECHNO GIKEN CO., LTD., Japan, "split fix"), and cut into nine blank printing sleeves having a width of 187 mm by the method (1) mentioned above, using a carbon dioxide gas laser engraving machine.

Simultaneously with cutting, one notch (cut) for registration was also formed in a cut end. The nine blank printing sleeves had thickness tolerance with small fluctuation. The width of the cut portion was within the range of 0.8 to 1 mm in each cut portion. The edge part of the cured photosensitive resin layer was also cut finely. The hollow cylindrical support had no portion in which internal fibers were projected, and was cut finely as shown in FIG. 1. The surface of the split fix used was subjected to chrome plating at a thickness of 0.3 mm. For this reason, there were no cutting scratches on the surface of the split fix after cutting processing. In cutting and notch processing, processing was performed by the method (1) described above while the blank printing sleeve was rotated.

Eight printing sleeves having a pattern formed on the surface thereof were set in a dry offset can printer (made by Storey Machinery Co., Inc., USA), and eight colors were printed on the surface of an aluminum can. A time needed for an operation to attach the printing sleeve to an air cylinder and perform registration was not more than 2 minutes per printing sleeve. The time was significantly reduced compared with a time needed for an operation to attach the conventional sheet printing plate and perform registration (approximately 20 minutes per conventional sheet printing plate). Printing on the aluminum can was performed at a speed of 25 cans per second. It was recognized that the surface of the aluminum can was printed with good printing quality. Even when 1 million of cans were printed, any particular problem in durability was not produced.

Example 2

By the same method as that in Example 1, a blank printing sleeve having a width of 1800 mm was produced.

The blank printing sleeve was cut using the water beam cutting method, and nine blank printing sleeves having a width of 187 mm were obtained. A notch (cut) for registration was also formed simultaneously with cutting in the same manner as in Example 1.

By the same method as that in Example 1, a pattern was formed on the surface of the blank printing sleeve with a carbon dioxide gas laser engraving machine to produce a printing sleeve. An edge of the cut portion of the obtained printing sleeve was cut finely, and projection of fibers was not observed, either. An edge part of the cured photosensitive resin layer was also very sharp.

Example 3

An amount of 70 parts by weight of polycarbonate polyurethane having a number average molecular weight of approximately 100,000 (made by Dainichiseika Color & Chemicals Mfg. Co., Ltd., Japan, "Rezamin® P890") as the resin (f), 30 parts by weight of phenoxy ethyl methacrylate (molecular weight of 190), 1 part by weight of trimethylolpropane triacrylate (molecular weight of 338), and parts by weight of C-1504 as the organic compound (g), 0.5 parts by weight of benzophenone and 0.6 parts by weight of 2,2-dimethoxy-2-phenylacetophenone as the photopolymerization initiator, and 0.5 parts by weight of 2,6-di-t-butyl acetophenone (made by JAPAN CHEMTECH LTD., Japan, "IONOL® CP") as a stabilizer were mixed at a temperature of 130° C. using a kneader (made by MORIYAMA COMPANY LTD., Japan, a small capacity pressurization type kneader "D1-5") to prepare a photosensitive resin composition. Using a biaxial extruding apparatus (made by TECHNOVEL CORPORATION, Japan, "KZW-TW"), the obtained photosensitive resin composition was extruded at a thickness of 0.8 mm onto a PET film having a thickness of 100 μm in which a urethane resin adhesive was thinly applied to the surface thereof (made by Toray Industries, Inc., Japan, U35). The photosensitive resin composition was sandwiched between the PET film and a cover sheet having a thickness of 50 μm and subjected to silicone mold releasing treatment (made by Fujimori Kogyo Co., Ltd., Japan), to form a sheet-like photosensitive resin composition.

On a hollow cylindrical support made of a epoxy resin reinforced with glass fibers, and having a width of 1800 mm, a thickness of 1.5 mm, and an inner diameter of 202.96 mm (made by Polywest Kunststofftechnik Saueressig & Partner GmbH & Co. KG, Germany), a double-sided adhesive tape having a thickness of 100 μm was attached by one round so as not to include bubbles between the tape and the hollow cylindrical support. The sheet-like photosensitive resin composition was attached onto the double-sided adhesive tape with the PET film facing inward. The cover sheet was peeled off, and a stick heated at 160° C. was pressed against a seam without any gap in the seam. Thereby, the ends of the sheet-like photosensitive resin composition were welded, and fixed.

While the hollow cylindrical support was rotated, a blank printing sleeve was produced by irradiation with light of the same metal halide lamp as that in Example 1. Reliefs of approximately 50 μm at the seam existed in a straight shape in the long axial direction of the hollow cylindrical support.

By the same method as that in Example 1, the blank printing sleeve was cut to produce nine blank printing sleeves having a width of 187 mm. However, notch processing was performed on the seam. An edge of the cut portion of the obtained blank printing sleeve was cut finely, and projection of fibers was not observed, either. An edge part of the cured photosensitive resin layer was also very sharp.

An image pattern was formed on the surface of the obtained blank printing sleeve using the carbon dioxide gas laser engraving machine, and used for printing of the surface of an aluminum can. Laser engraving was performed on the basis of the formed notch, and laser engraving was performed to the depth of 0.5 mm so that the seam might not be included in the image portion. For this reason, the reliefs that existed in the seam did not cause any problem in the printing step.

Example 4

An amount of 70 parts by weight of a styrene-butadiene-styrene block copolymer having an average of an approximately two polymerizable unsaturated groups in the molecular per one molecule and a number average molecular weight of approximately 100,000 as the resin (f), 10 parts by weight of hexamethylene diacrylate (molecular weight of 254), 15 parts by weight of liquid polybutadiene having a number average molecular weight of 2000, 10 parts by weight of an alicyclic hydrocarbon plasticizer (made by Arakawa Chemical Industries, Ltd., Japan, ARKON® P-70), and 5 parts by weight of C-1504 as the organic compound (g), 0.5 parts by weight of benzophenone and 0.6 parts by weight of 2,2-dimethoxy-2-phenylacetophenone as the photopolymerization initiator, and 0.5 parts by weight of 2,6-di-t-butyl acetophenone (made by JAPAN CHEMTECH LTD., Japan, "IONOL® CP") as a stabilizer were mixed at a temperature of 130° C. using a kneader (made by MORIYAMA COMPANY LTD., Japan, a small capacity pressurization type kneader "D1-5") to prepare a photosensitive resin composition. Using a biaxial extruding apparatus, the obtained photosensitive resin composition was extruded at a thickness of 0.8 mm onto a PET film having a thickness of 100 µm in which a polyurethane resin adhesive was thinly applied to the surface thereof (made by Toray Industries, Inc., Japan, U35). The photosensitive resin composition was sandwiched between the PET film and a cover sheet having a thickness of 50 µm and subjected to silicone mold releasing treatment (made by Fujimori Kogyo Co., Ltd., Japan) to form a sheet-like photosensitive resin composition.

On a hollow cylindrical support made of an epoxy resin reinforced with glass fibers, and having a width of 1800 mm, a thickness of 1.5 mm, and an inner diameter of 202.96 mm (made by Polywest Kunststofftechnik Saueressig & Partner GmbH & Co. KG, Germany), a double-sided adhesive tape having a thickness of 100 µm was attached by one round so as not to include bubbles between the tape and the hollow cylindrical support. The sheet-like photosensitive resin composition was attached onto the double-sided adhesive tape with the PET film facing inward. The cover sheet was peeled off, and a stick heated at 160° C. was pressed against a seam without any gap in the seam. Thereby, the ends of the sheet-like photosensitive resin composition were welded, and fixed. Then, calendaring treatment to contact a metallic roll heated at 140° C. was performed on the surface of the photosensitive resin composition to relieve the reliefs of the seam. The reliefs of the seam were improved to be approximately 20 µm. While the hollow cylindrical support was rotated, a blank printing sleeve was produced by irradiation with light of the same metal halide lamp as that in Example 1.

By the same method as that in Example 1, a notch was formed simultaneously with laser cutting in the circumferential direction of the blank printing sleeve. However, notch processing was performed on the seam.

Then, carbon dioxide gas laser engraving was performed on the basis of the processed notch, and dry offset printing was performed on the surface of an aluminum can. Printing quality of the obtained printed matter was good, and a fine gradation could also be expressed.

Example 5

By the same method as that in Example 1, a blank printing sleeve having a width of 1800 mm was produced.

Bubbles having a diameter of approximately 300 µm and including foreign substances existed at several places in the cured photosensitive resin layer. Accordingly, these portions were marked using a magic marker.

Instead of the laser engraving machine used in Example 1, cutting and notch processing were performed using a laser cutting notch processing machine (made by TECHNO GIKEN CO., LTD., Japan) on which a laser marker (made by KEYENCE CORPORATION, Japan, "ML-Z9550") that can use a galvanomirror for an optical system and can scan with a laser beam of a carbon dioxide gas laser (average output: 30 W) in the two-dimensional direction was mounted. Cutting processing was performed in the circumferential direction while the blank printing sleeve was rotated. Next, a semicircular notch having a diameter of 6 mm was formed in an end of the cut blank printing sleeve so that three defective portions in which bubbles existed might be in a position not included in an image pattern formed at the laser engraving step (i.e., in a portion engraved at a depth of not less than 0.3 mm at the time of laser engraving). The cutting portion and the notch were processed finely without glass fibers within the hollow cylindrical support being exposed. The processed notch has a complicated shape, but tolerance in size was not more than 20 µm. Although the defective portions due to the bubble existed in the cured photosensitive resin layer, notch processing was performed so that the defective portions might not be included in the image portion. For that reason, all of the ten blank printing sleeves obtained by processing could be used at a subsequent step as an excellent article.

Example 6

In the laser cutting and notch processing step, a printing sleeve was produced in the same manner as in Example 1 except that an air-lock type air cylinder (made by Watanabe Kikou Sha, Japan) was used instead of the split fix used in Example 1. The surface of the air-lock type air cylinder used was subjected to chrome plating at a thickness of 0.3 mm. In the air cylinder, a groove having a depth of 1 mm and a width of 1 mm was formed in the circumferential direction in which the printing sleeve was cut by the carbon dioxide gas laser. The air cylinder had an air lock mechanism at 40 points on the surface thereof. A minute metallic ball having a diameter of 2 mm is inserted into the air lock mechanism. When the ball is pressed by the hollow cylindrical support, air is ejected to expand the hollow cylindrical support. Thereby, the hollow cylindrical support can be attached to and detached from the air cylinder.

There was no cutting scratch on the surface of the air cylinder and no damage on the surface of the air cylinder caused by laser cutting.

Example 7

The same photosensitive resin composition as that used in Example 1 was laminated on a hollow cylindrical support so as to have a thickness of 0.5 mm, the hollow cylindrical support (made by AKL Flexo Technik GmbH, Germany) having a thickness of 0.38 mm, an inner diameter of 226.12 mm, and a width of 1800 mm and being reinforced with a polyethylene cloth to which a photo-curable adhesive (made by Notepu Kogyo K. K., Japan, ACRYTACK® T-1050) was applied at a thickness of 0.1 mm. Using a metal halide lamp (made by Fusion UV Systems, Inc., USA, F450V type UV lamp) as a light source, the photosensitive resin composition layer was exposed on a condition of 4000 mJ/cm$^2$ at 350 nm to form a cured photosensitive resin layer.

The surface of the produced cured photosensitive resin layer was rotated at a high speed, and ground and polished to adjust the thickness of the blank printing sleeve at 0.92 mm and the surface roughness Ra at 0.5 µm. The thickness in the circumferential direction of the hollow cylindrical support was measured at ten points in the width direction thereof. Then, the range of fluctuation in the thickness fell within 30 µm.

The produced blank printing sleeve having a width of 1800 mm was cut into nine blank printing sleeves having a width of 187 mm using the laser engraving machine. Simultaneously with cutting, one notch (cut) for registration was also formed in a cut end. The nine blank printing sleeves had thickness tolerance with small fluctuation. The width of the cut portion was within the range of 0.8 to 1 mm in each cut portion. The edge part was cut sharply, and the edge part of the cured photosensitive resin layer was also cut finely. The hollow cylindrical support had no portion in which internal fibers were projected, and was cut finely.

A relief and projection pattern was formed on the surface of the obtained blank printing sleeve using the carbon dioxide gas laser engraving machine.

Eight printing sleeves having a pattern formed on the surface thereof were set in a dry offset can printer (made by Storey Machinery Co., Inc., USA), and eight colors were printed on the surface of an aluminum can. A time needed for an operation to attach the printing sleeve to an air cylinder and perform registration was not more than 2 minutes per printing sleeve. The time was significantly reduced compared with a time needed for an operation to attach the conventional sheet printing plate and perform registration (approximately 20 minutes per conventional sheet printing plate). Printing on the aluminum can was performed at a speed of 25 cans per second. It was recognized that the surface of the aluminum can was printed with good printing quality. Even when 1 million of cans were printed, any particular problem in durability was not produced.

Example 8

By the same method as that in Example 7, a blank printing sleeve having a width of 1800 mm was produced. The blank printing sleeve was cut using the water beam cutting method, and nine blank printing sleeves having a width of 187 mm were obtained. A notch for registration was also formed simultaneously with cutting in the same manner as in Example 1.

By the same method as that in Example 1, a pattern was formed on the surface of the blank printing sleeve with a carbon dioxide gas laser engraving machine to produce a printing sleeve. An edge of the cut portion of the obtained printing sleeve was cut finely, and projection of fibers was not observed, either. An edge part of the cured photosensitive resin layer was also very sharp.

Comparative Example 1

A blank printing sleeve was produced as follows: an EPMD rubber (made by Ligum spol. s. r. o., Czech) formed by winding a ribbon-like crude rubber on a hollow cylindrical support made of an epoxy resin reinforced with glass fibers, and having a width of 1800 mm, a thickness of 1.5 mm, and an inner diameter of 202.96 mm (made by Polywest Kunststofftechnik Saueressig & Partner GmbH & Co. KG, Germany), and by heat crosslinking the ribbon-like crude rubber using an autoclave was ground and polished so as to have a thickness of 1 mm.

By the same method as that in Example 1, laser cutting of the blank printing sleeve was performed. A part of the EPDM rubber removed by the laser was welded and remained in an edge part of the EPDM rubber layer. In order to remove the welded portion, the end was treated using a blush. However, the welded portion could not be removed easily, and it took a considerable time to remove the welded portion.

An image pattern was formed on the surface of the blank printing sleeve by the laser engraving. Using the obtained printing sleeve, the surface of an aluminum can was printed by the same method as that in Example 1 with the dry offset printing method. Scum was welded in highlight dot portions, and it took some time to remove the scum. The printing sleeve swelled with respect to a hydrocarbon solvent in an ink used in printing, and particularly, dots of the highlight dot portion were enlarged, resulting in a dark printed matter.

A time needed to feed a compressed air into an air cylinder of the printer to detach the printing sleeve after printing was longer than that in the case of a printing sleeve having a thinner thickness.

Comparative Example 2

Figure 2:
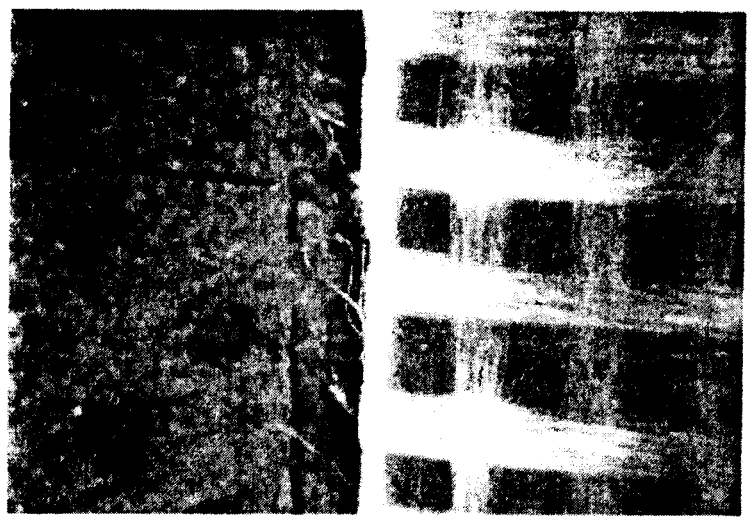
FIG. 2 shows a photograph in which edge parts of a blank printing sleeve for laser engraving cut by a cutter in Comparative Example 2 is photographed from a hollow side of the blank printing sleeve.
Figure 3:
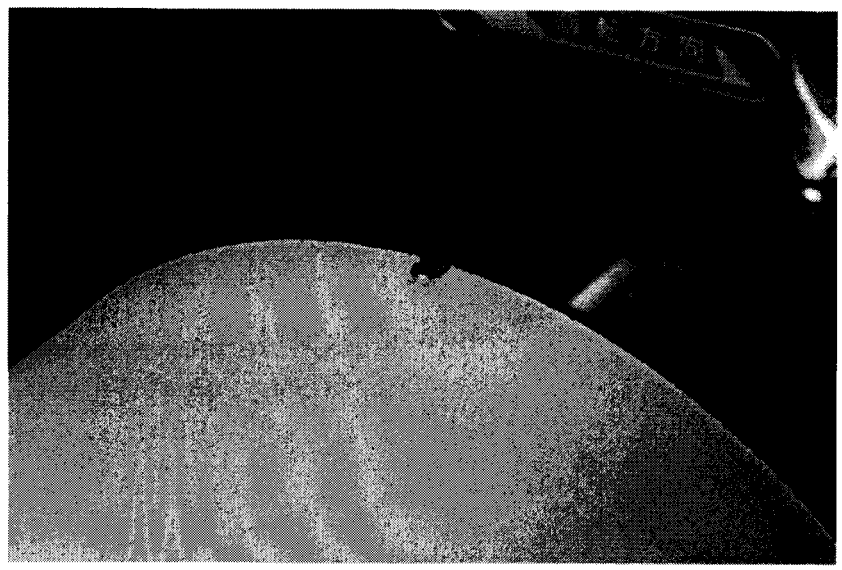
FIG. 3 shows a photograph in which a pin and a notch for registration in Example 1 are photographed.

A blank printing sleeve having a width of 187 mm was produced by the same method as that in Example 1 except that the method for cutting a blank printing sleeve was a method by a cutter using a rotary cutter instead of the laser cutting method, and a split fix in which an urethane rubber was attached to the surface thereof and the outline can be changed (made by TECHNO GIKEN CO., LTD., Japan) was used. In the cutting method by a cutter, cutting was performed while the blank printing sleeve and the rotary cutter were rotated. It was recognized that cutting was performed at a width of the cut portion of 0.6 mm. The cut blank printing sleeve could be easily detached by contracting the outline of the above-mentioned split fix. However, there were cutting scratches on the surface of the split fix in the circumferential direction thereof. In an edge of the cut portion of the obtained printing sleeve, projection of fibers was slightly observed as shown in FIG. 2. There existed cutting scratches also on the side surface of the edge part of the cured photosensitive resin layer. When the blank printing sleeve was carried, glass fibers exposed from the edge part touched hands, and the glass fibers pierced in the skin.

The present application is based on Japanese Patent Application No. 2008-153843, filed on Jun. 12, 2008 to Japan Patent Office, and the subject of which is incorporated herein by reference.

INDUSTRIAL APPLICABILITY

According to the present invention, it is possible to provide a method that can produce a large amount of narrow blank printing sleeves and printing sleeves with high tolerance in size in a short time, and can easily process edge parts of the blank printing sleeve and the printing sleeve with high accuracy.

The present invention has industrial applicability in a field of printing techniques such as flexographic printing and offset printing.

The invention claimed is:

1. A method for producing a blank printing sleeve for laser engraving, comprising the steps of:
   (1) laminating a photosensitive resin composition layer (a) on a hollow cylindrical support (b);
   (2) photo-curing the laminated photosensitive resin composition layer (a) to form a cured photosensitive resin layer (c);
   (3) cutting the hollow cylindrical support (b) and the cured photosensitive resin layer (c) approximately in a circumferential direction of the hollow cylindrical support (b) by a laser cutting method and/or a water beam cutting method; and
   (4) forming a notch for registration in the formed cut portion of the hollow cylindrical support (b) and the cured photosensitive resin layer (c).

2. The method for producing the blank printing sleeve for laser engraving according to claim 1, wherein the step (3) comprises a step of cutting the hollow cylindrical support (b)

while rotating the hollow cylindrical support (b) approximately in the circumferential direction thereof.

3. The method for producing the blank printing sleeve for laser engraving according to claim 1, wherein the notch is formed on an approximately straight line in a long axial direction of the hollow cylindrical support (b).

4. The method for producing the blank printing sleeve for laser engraving according to claim 1, wherein a defective portion exists in the cured photosensitive resin layer (c), and the notch is formed to include the defective portion in a relief formed by laser engraving.

5. The method for producing the blank printing sleeve for laser engraving according to claim 1, wherein the hollow cylindrical support (b) is fixed, and scanned with a laser beam and/or a water beam to form the notch.

6. The method for producing the blank printing sleeve for laser engraving according to claim 1, wherein the laser beam is an infrared ray having an oscillation wavelength of not less than 5 μm and not more than 20 μm or an ultraviolet ray having an oscillation wavelength of not less than 150 nm and not more than 400 nm, has a diameter of not less than 0.01 mm and not more than 1 mm, and has an average output of not more than 100 W.

7. The method for producing the blank printing sleeve for laser engraving according to claim 1, wherein a pressure of the water beam is not less than 50 MPa and not more than 450 MPa, and a diameter of the water beam is not less than 0.05 mm and not more than 2 mm.

8. The method for producing the blank printing sleeve for laser engraving according to claim 1, wherein the step (1) comprises the steps of:
   winding the photosensitive resin composition layer (a) around the hollow cylindrical support (b); and
   welding ends of the photosensitive resin composition layer (a) in a direction approximately parallel to a long axis of the hollow cylindrical support (b).

9. The method for producing the blank printing sleeve for laser engraving according to claim 1, wherein the step (1) comprises a step of extruding and laminating a photosensitive resin composition (a) on the hollow cylindrical support (b).

10. The method for producing the blank printing sleeve for laser engraving according to claim 1, wherein a protective layer exists in a surface of the cylindrical support, and the protective layer contains at least one metal selected from the group consisting of chromium, tungsten, tantalum, and titanium, and/or a metal oxide thereof.

11. A method for producing a laser engraved printing sleeve, comprising a step of forming an image by laser engraving on the blank printing sleeve for laser engraving produced by the method according to claim 1.

\* \* \* \* \*